(12) United States Patent
Enokido

(10) Patent No.: US 7,324,683 B2
(45) Date of Patent: *Jan. 29, 2008

(54) BONDING PATTERN DISCRIMINATION DEVICE

(75) Inventor: Satoshi Enokido, Hachioji (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/582,586

(22) Filed: Oct. 16, 2006

(65) Prior Publication Data

US 2007/0036424 A1  Feb. 15, 2007

Related U.S. Application Data

(62) Division of application No. 10/959,241, filed on Oct. 6, 2004, now Pat. No. 7,224,829.

(30) Foreign Application Priority Data

Oct. 7, 2003  (JP) .............................. 2003-348887

(51) Int. Cl.
*G06K 9/00* (2006.01)

(52) U.S. Cl. ..................... 382/145; 156/351; 156/358; 228/103; 324/765; 382/218; 382/294

(58) Field of Classification Search .............. 156/351, 156/358; 228/4.5, 103; 324/765; 382/145, 382/151, 218, 294, 147
See application file for complete search history.

(56) References Cited

U.S. PATENT DOCUMENTS

| 4,958,762 | A | * | 9/1990 | Shimizu et al. | 228/1.1 |
| 5,901,241 | A | * | 5/1999 | Koljonen et al. | 382/150 |
| 6,016,358 | A | * | 1/2000 | Balamurugan | 382/151 |
| 6,381,359 | B1 | * | 4/2002 | Hayata | 382/151 |
| 6,917,699 | B2 | * | 7/2005 | Sugawara | 382/151 |
| 7,224,829 | B2 | * | 5/2007 | Enokido | 382/145 |
| 2007/0036423 | A1 | * | 2/2007 | Enokido | 382/151 |
| 2007/0036424 | A1 | * | 2/2007 | Enokido | 382/151 |
| 2007/0036425 | A1 | * | 2/2007 | Enokido et al. | 382/151 |
| 2007/0041632 | A1 | * | 2/2007 | Enokido et al. | 382/151 |

FOREIGN PATENT DOCUMENTS

| JP | 63-56764 | 3/1988 |
| JP | 2864735 | 3/1999 |
| JP | 2002-208010 | 7/2002 |

* cited by examiner

*Primary Examiner*—Gregory M Desire
(74) *Attorney, Agent, or Firm*—William L. Androlia; H. Henry Koda

(57) ABSTRACT

Determination of inclination of positioning patterns used in bonding being made by: imaging a positioning pattern of reference chip and taking such image as reference-image; specifying a polar coordinate conversion origin for the reference-image; imaging an object (chip) of bonding to use it as an object-image, thus obtaining a relative positional-relationship with the reference-image; specifying the polar coordinate conversion origin of the object-image, so that the object-image is subjected to a polar coordinate conversion; and calculating inclination-angle from both images that have been subjected to a polar coordinate conversion; thus using a point, in which an error in position of the object of comparison detected by pattern matching between an image, which is the object of comparison obtained by imaging the object of comparison disposed in an attitude that includes positional deviation, and the reference-image, shows a minimal value, as an origin of the polar coordinate conversion.

1 Claim, 11 Drawing Sheets

BONDING PATTERN DISCRIMINATION DEVICE

This application is a divisional of Ser. No. 10/959,241 now U.S Pat. No. 7,224,829, filed Oct. 6, 2004.

BACKGROUND OF THE INVENTION

1. Technical Field

The present invention relates to bonding pattern discrimination, and more particularly, to a bonding pattern discrimination method, a bonding pattern discrimination device and a bonding pattern discrimination program for discriminating the inclination of positioning patterns used in bonding.

2. Description of the Related Art

In cases where chips are die-bonded to circuit boards, and in cases where wire bonding that connects wires to bonding leads of circuit boards from the bonding pads of chips disposed on the circuit boards is performed, there may be instances in which the positioning is poor so that the chips are disposed at an inclination. In order to prevent this, the external shapes of the chips themselves or positioning patterns formed on the surfaces of the chips are observed, and this inclination is detected.

Methods in which the edges of the positioning patterns are detected and the inclination is calculated, or methods in which two separated positioning patterns are formed, and the inclination is calculated by defining line segments between these positioning patterns are used to detect the inclination by way of using positioning patterns. In the method of Japanese Patent Application Laid-Open (Kokai) No. S63-56764, pattern matching between a reference-image prepared beforehand and the object-image is performed by successively rotating the reference-image from 0 to 360° for each pattern matching in cases where there is rotation, repeating pattern matching for each angle, and judging the locations and angles that show the best match as a result.

Furthermore, in the method of Japanese Patent No. 2864735, square regions that are to be compared are extracted from object-image signals obtained by imaging, the image signals contained in the extracted square regions are converted into image signals with polar coordinates by way of using the corners of the square regions as the origin, radial-direction patterns for respective specified angles and radial-direction patterns in the reference angles of reference-images prepared beforehand and subjected to a polar coordinate conversion are successively compared, and the comparative angle of the object-image is calculated.

Furthermore, in Japanese Patent Application Laid-Open (Kokai) No. 2002-208010, an approach by way of using a rotation-resistant reference point is disclosed as a means for performing high-precision position detection without performing pattern matching in the rotational direction (which tends to involve an increase in the quantity of calculations) even in cases where the object of comparison is disposed in an attitude that includes positional deviation in the rotational direction. Here, according to Japanese Patent Application Laid-Open (Kokai) No. 2002-208010, the term "rotation-resistant reference point" refers to a point which is such that the error in the position of the object of comparison that is detected in pattern matching of the reference-image and an image of the object of comparison that is obtained by imaging the object of comparison disposed in an attitude that includes positional deviation in the direction of rotation shows a minimum value. Furthermore, in Japanese Patent Application Laid-Open (Kokai) No. 2002-208010, it is indicated that normalized correlation calculations can be used as one method of pattern matching. The following embodiment is shown as a method for calculating the rotation-resistant, reference point.

In the first embodiment, the rotation-resistant reference point is calculated as follows. Specifically, with one corner of the reference-image taken as the center, a rotated image that is rotated +Q° is produced, and the coordinates (X1, Y1) of the point showing the best match as a result of pattern matching between this rotated image and the reference-image are determined. Similarly, a rotated image that is rotated −Q° is produced, and the coordinates (X2, Y2) of the point showing the best match as a result of pattern matching between this rotated image and the reference-image are determined. The coordinates (AX1, AY1) of the rotation-resistant reference point are expressed by the following Equations (1) through (4) by way of using the coordinates (X1, Y1), (X2, Y2) of these two points, the angle Q° and the coordinates (XC1, YC1) of the corner point taken as the center of rotation.

$$AX1 = XC1 + r\cos\alpha \tag{1}$$

$$AY1 = YC1 + r\sin\alpha \tag{2}$$

$$\text{Here, } \alpha = \tan^{-1}\{(X_2 - X_1)/(Y_1 - Y_2)\} \tag{3}$$

$$r = \sqrt{\{(X_2 - X_1)^2 + (Y_1 - Y_2)^2\}}/2\sin Q \tag{4}$$

The rotation-resistant reference point determined by this method is the center of the object in cases where the pattern used is the shape of the object. For example, in the case of a circle, the center point of the circle is the rotation-resistant reference point, and in the case of a square, the center point of the square is the rotation-resistant reference point.

The second embodiment is a simpler method for calculating the rotation-resistant reference point. Specifically, a plurality of rotational center points are set within the reference-image. Then, the reference-image is rotated +Q° about each rotational center point. The amounts of matching between the respective rotated images thus obtained and the reference-image are respectively calculated. Then, a rotational center point with a relatively large amount of matching (among the plurality of rotational center points) is taken as the rotation-resistant reference point. In this case, a rotational center point that is set in the vicinity of the center of the pattern used is taken as the rotation-resistant reference point.

It is indicated that the coordinates of points used in bonding can be determined with high precision, without any need to perform pattern matching in the rotational direction, by thus calculating the coordinates of the rotation-resistant reference point, and taking this point as a bonding alignment point, i.e., a bonding positioning point.

In bonding apparatuses or bonding techniques, higher-precision positioning and faster positioning for higher-speed bonding are demanded. The above-described prior art suffers from the following problems in the rapid, high-precision detection of the inclination of positioning patterns used in bonding.

Methods that determine the inclination by edge detection are not suitable for use in cases where considerable edges are not contained in the patterns, and the precision is influenced by the properties of the edges. In methods that determine the inclination of line segments between separated positioning patterns, the visual field magnification drops if an attempt is made to observe both positioning patterns at the same time, so that the precision is poor; furthermore, time is required in order to observe respective positioning patterns in separate visual fields.

In the case of methods in which the reference-image is successively rotated from 0 to 360° when pattern matching is performed, and pattern matching is repeated for the respective angles, the processing time is increased. Furthermore, although a group of reference-images that are successively rotated from 0 to 360° can be prepared beforehand and pattern matching can be performed by way of using these reference-images, the quantity of data is enormous and the processing time is also lengthened.

In the case of methods that use a polar coordinate conversion, the precision is greatly influenced by the manner in which the origin is established. For example, in cases where the positioning pattern has a circular shape, the polar coordinate development can be performed with good reproducibility if the center of the circular shape is taken as the origin of polar coordinate development. However, there is no angle dependence of the developed pattern, so that actual angle detection is impossible. In cases where the positioning pattern is asymmetrical, the conditions of the developed pattern vary according to the placement of the origin of the polar coordinate development; as a result, the precision of angle detection is influenced. In the method disclosed in Japanese Patent No. 2864735, it is proposed that polar coordinate conversions be respectively performed for the four corners of the square regions, and that the inclination-angle be determined based upon these conversions; in this case, however, the processing time increases.

In methods that calculate a rotation-resistant reference point, and take this point as a positioning point of bonding, positions can be determined with high precision, but the inclination-angle of the positioning patterns cannot be determined. In die bonding, however, not only the bonding position of the chip but also the inclination-angle is important, and in wire bonding, not only the position of the positioning pattern but also the inclination-angle of the positioning pattern is important for estimating the positions of the respective bonding pads from positioning pattern information.

Thus, in the prior art, problems remain regarding the rapid, high-precision discrimination of the inclination of positioning patterns used in bonding.

BRIEF SUMMARY OF THE INVENTION

The object of the present invention is to solve the above-described problems encountered in the prior art, and to provide a bonding pattern discrimination method, bonding pattern discrimination device and bonding pattern discrimination program that make it possible to discriminate the inclination of positioning patterns used in bonding more quickly and with greater precision.

The above-described object is accomplished by a unique steps of the present invention for a bonding pattern discrimination method for discriminating the inclination of a positioning pattern used in bonding; and in the present invention, the bonding pattern discrimination method includes:
 a reference-image acquisition step that makes an image of positioning pattern for a reference chip that serves as a reference for discriminating the inclination of the positioning pattern and obtains the image as a reference-image;
 a reference conversion origin specifying step that specifies the conversion origin that is used for the polar coordinate conversion of the reference-image;
 a reference-image conversion step that performs a polar coordinate conversion on the reference-image by way of using the specified reference conversion origin thus producing a post-conversion reference-image;
 an object-image acquisition step that makes an image of the positioning pattern for the chip that is the object of bonding and acquires the image as an object-image;
 a positional-relationship calculation step that moves the positioning pattern of the reference-image and the positioning pattern of the object-image in relative terms so that both images are superimposed, so that the relative positional-relationship between the positioning pattern of the reference chip and the positioning pattern of the bonding object chip is calculated from the amount of the movement;
 an object conversion origin specifying step that specifies an origin that is used in order to subject the object-image to a polar coordinate conversion based upon the calculated relative positional-relationship by a positional-relationship that is the same as the positional-relationship between the positioning pattern and the reference conversion origin in the reference-image;
 an object-image conversion step that performs a polar coordinate conversion on the object-image by way of using the specified object conversion origin, thus producing a post-conversion object-image, and
 an inclination-angle calculation step that moves both post-conversion images in relative terms on the angular axis so that the positioning pattern developed in polar coordinates in the post-conversion object-image and the positioning pattern developed in polar coordinates in the post-conversion reference-image are superimposed, so that the relative inclination-angle between the positioning pattern of the reference chip and the positioning pattern of the bonding object chip is calculated from the amount of the movement angle;
wherein the reference conversion origin specifying step is comprised of:
 a rotated image acquisition step that acquires a rotated image produced by rotating the reference-image through a specified angle, and
 a pattern matching step that performs pattern matching by causing relative movement of the reference-image and rotated image so that the positioning pattern of the reference-image and the positioning pattern of the rotated image are superimposed; and
 a reference conversion origin, which is such that the error in the relative positional-relationship between the two positioning patterns detected by pattern matching of an image that is the object of comparison obtained by imaging-positioning patterns disposed in an attitude that includes positional deviation in the direction of rotation, and a reference-image obtained by imaging-positioning patterns containing no positional deviation in the direction of rotation shows a minimal value, is specified based upon the results of the pattern matching.

In the above bonding pattern discrimination method of the present invention, it is preferable that:
 the reference conversion origin specifying step include a specified positional-relationship calculating step that calculates a specified positional-relationship that is the relative positional-relationship between the positioning pattern of the reference-image and the positioning pattern of the rotated image based upon pattern matching from the amount of relative movement between the reference-image and the rotated image; and a reference conversion origin, which is such that the error in the relative positional-relationship between the two positioning patterns detected by pattern matching of an image that is the object of comparison obtained by imaging-positioning patterns disposed in an attitude that includes positional deviation in the direction of rotation and a reference-image obtained by imaging-positioning patterns containing no positional deviation in the direction of rotation shows a minimal value, be specified based upon the calculated positional-relationship and the specified angle.

In addition, the above-described object is accomplished by further unique steps of the present invention for a bonding pattern discrimination method for discriminating the inclination of a positioning pattern used in bonding; and in the present invention, the bonding pattern discrimination method includes:

a reference-image acquisition step that makes an image of positioning pattern for a reference chip that serves as a reference for discriminating the inclination of the positioning pattern and obtains the image as a reference-image;

a reference conversion origin specifying step that specifies the conversion origin that is used for the polar coordinate conversion of the reference-image;

a reference-image conversion step that performs a polar coordinate conversion on the reference-image by way of using the specified reference conversion origin, thus producing a post-conversion reference-image;

an object-image acquisition step that makes an image of the positioning pattern for the chip that is the object of bonding and acquires the image as an object-image;

a positional-relationship calculation step that moves the positioning pattern of the reference-image and the positioning pattern of the object-image in relative terms so that both images are superimposed, so that the relative positional-relationship between the positioning pattern of the reference chip and the positioning pattern of the bonding object chip is calculated from the amount of the movement;

an object conversion origin specifying step that specifies an origin that is used in order to subject the object-image to a polar coordinate conversion based upon the calculated relative positional-relationship by a positional-relationship that is the same as the positional-relationship between the positioning pattern and the reference conversion origin in the reference-image;

an object-image conversion step that performs a polar coordinate conversion on the object-image by way of using the specified object conversion origin, thus producing a post-conversion object-image; and an inclination-angle calculation step that moves both post-conversion images in relative terms on the angular axis so that the positioning pattern developed in polar coordinates in the post-conversion object-image and the positioning pattern developed in polar coordinates in the post-conversion reference-image are superimposed, so that the relative inclination-angle between the positioning pattern of the reference chip and the positioning pattern of the bonding object chip is calculated from the amount of the movement angle;

wherein the reference conversion origin specifying step includes:

a rotational center point setting step that sets a plurality of rotational center points in arbitrary positions within the reference-image;

a rotated image acquisition step that acquires rotated images by rotating the reference-image through a specified angle about each of the rotational center points, and a matching amount calculation step that calculates the amount of pattern matching that indicates the degree of overlapping between the positioning pattern of the rotated image and the positioning pattern of the reference-image, on each of the rotated images; and wherein a rotational center, whose pattern matching amount is within a specified range from a maximum value thereof, or a point, which is within a proximate region of said rotational center, is specified as a reference conversion origin in which an error in a relative positional-relationship between both positioning patterns detected by pattern matching of an image of an object of comparison, which is obtained by imaging a positioning pattern disposed in an attitude that includes positional deviation in the direction of rotation, and a reference-image, which is obtained by imaging a positioning pattern containing no positional deviation in the direction of rotation, shows a minimal value.

In the above bonding pattern discrimination method of the present invention, it is preferable that the reference-image conversion step perform a polar coordinate conversion with the reference conversion origin as the origin of angular development, with the angular range in which the polar coordinate reference-image pattern is not contained being excluded.

Furthermore, in the above bonding pattern discrimination method of the present invention, it is preferable that:

the reference-image conversion step perform a polar coordinate conversion at a radius having a length that envelops a reference-image that takes the reference conversion origin as the origin of the radius, so that a post-conversion reference-image be produced with the region outside the reference-image being masked; and the inclination-angle calculation step view the overlapping between the two positioning patterns with the masked region of the post-conversion reference-image excluded.

Furthermore, the above-described object is accomplished by a unique structure of the present invention for a bonding pattern discrimination apparatus for discriminating the inclination of a positioning pattern used in bonding; and in the present invention, the bonding pattern discrimination apparatus includes:

a reference-image acquisition means that makes an image of positioning pattern for a reference chip that serves as a reference for discriminating the inclination of the positioning pattern and obtains the image as a reference-image;

a reference conversion origin specifying means that specifies the conversion origin that is used for the polar coordinate conversion of the reference-image;

a reference-image conversion means that performs a polar coordinate conversion on the reference-image by way of using the specified reference conversion origin, thus producing a post-conversion reference-image;

an object-image acquisition means that makes an image of the positioning pattern for the chip that is the object of bonding and acquires the image as an object-image;

a positional-relationship calculation means that moves the positioning pattern of the reference-image and the positioning pattern of the object-image in relative terms so that both images are superimposed, so that the relative positional-relationship between the positioning pattern of the reference chip and the positioning pattern of the bonding object chip is calculated from the amount of the movement;

an object conversion origin specifying means that specifies an origin that is used in order to subject the object-image to a polar coordinate conversion based upon the calculated relative positional-relationship by a positional-relationship that is the same as the positional-relationship between the positioning pattern and the reference conversion origin in the reference-image;

an object-image conversion means that performs a polar coordinate conversion on the object-image by way of using the specified object conversion origin, thus producing a post-conversion object-image; and an inclination-angle calculation means that moves both post-conversion images in relative terms on the angular axis so that the positioning pattern developed in polar coordinates in the post-conversion object-image and the positioning pattern developed in polar coordinates in the post-conversion reference-image are superimposed, so that the relative inclination-angle between the positioning pattern of the reference chip and the positioning pattern of the bonding object chip is calculated from the amount of the movement angle;

wherein the reference conversion origin specifying means includes:

a rotated image acquisition means that acquires a rotated image produced by rotating the reference-image through a specified angle, and a pattern matching means that performs pattern matching by causing relative movement of the reference-image and rotated image so that the positioning pattern of the reference-image and the positioning pattern of the rotated image are superimposed; and a reference conversion origin, which is such that the error in the relative positional-relationship between the two positioning patterns detected by pattern matching of an image that is the object of comparison obtained by imaging-positioning patterns disposed in an attitude that includes positional deviation in the direction of rotation, and a reference-image obtained by imaging-positioning patterns containing no positional deviation in the direction of rotation shows a minimal value, is specified based upon the results of the pattern matching.

In addition, the above-described object is accomplished by unique processes of the present invention for a bonding pattern discrimination program for discriminating the inclination of a positioning pattern used in bonding; and in the present invention, the bonding pattern discrimination program includes:

a reference-image acquisition process that makes an image of positioning pattern for a reference chip that serves as a reference for discriminating the inclination of the positioning pattern and obtains the image as a reference-image;

a reference conversion origin specifying process that specifies the conversion origin that is used for the polar coordinate conversion of the reference-image;

a reference-image conversion process that performs a polar coordinate conversion on the reference-image by way of using the specified reference conversion origin; thus producing a post-conversion reference-image;

an object-image acquisition process that makes an image of the positioning pattern for the chip that is the object of bonding and acquires the image as an object-image;

a positional-relationship calculation process that moves the positioning pattern of the reference-image and the positioning pattern of the object-image in relative terms so that both images are superimposed, so that the relative positional-relationship between the positioning pattern of the reference chip and the positioning pattern of the bonding object chip is calculated from the amount of the movement;

an object conversion origin specifying process that specifies an origin that is used in order to subject the object-image to a polar coordinate conversion based upon the calculated relative positional-relationship by a positional-relationship that is the same as the positional-relationship between the positioning pattern and the reference conversion origin in the reference-image;

an object-image conversion process that performs a polar coordinate conversion on the object-image by way of using the specified object conversion origin, thus producing a post-conversion object-image; and an inclination-angle calculation process that moves both post-conversion images in relative terms on the angular axis so that the positioning pattern developed in polar coordinates in the post-conversion object-image and the positioning pattern developed in polar coordinates in the post-conversion reference-image are superimposed, so that the relative inclination-angle between the positioning pattern of the reference chip and the positioning pattern of the bonding object chip is calculated from the amount of the movement angle;

wherein the reference conversion origin specifying process includes:

a rotated image acquisition process that acquires a rotated image produced by rotating the reference-image through a specified angle, and a pattern matching process that performs pattern matching by causing relative movement of the reference-image and rotated image so that the positioning pattern of the reference-image and the positioning pattern of the rotated image are superimposed; and a reference conversion origin, which is such that the error in the relative positional-relationship between the two positioning patterns detected by pattern matching of an image that is the object of comparison obtained by imaging-positioning patterns disposed in an attitude that includes positional deviation in the direction of rotation, and a reference-image obtained by imaging-positioning patterns containing no positional deviation in the direction of rotation shows a minimal value, is specified based upon the results of the pattern matching.

In the bonding pattern discrimination of the present invention, as described above, a point which is such that the error in the position of the object in comparison detected by pattern matching of an image that is the object of comparison obtained by imaging the object of comparison disposed in an attitude that includes positional deviation in the direction of rotation, and a reference-image, shows a minimal value is used as the origin of the polar coordinate conversion. Accordingly, the inclination of positioning patterns used in bonding can be calculated quickly and with good precision.

DETAILED DESCRIPTION OF THE INVENTION

The present invention is based on the results of an investigation of the question of where to locate the origin in the detection of angles by way of using a polar coordinate conversion in order to achieve greater precision. In the prior art, as described above, the precision is influenced by the manner in which the origin is established in performing a polar coordinate conversion. Accordingly, when a point showing relative immunity to the effects of rotation was investigated, the rotation-resistant reference point of Japanese Patent Application Laid-Open (Kokai) No. 2002-208010 attracted attention. The rotation-resistant reference point in the same reference is not used to determine angles. However, as described above, this point is "a point which is such that the error in the position of the object of comparison that is detected in pattern matching of the reference-image and an image of the object of comparison that is obtained by imaging the object of comparison disposed in an attitude that includes positional deviation in the direction of rotation shows a minimum value".

Accordingly, it was thought that this point could be viewed as a point that is relatively unaffected even if there is rotation, and that it might be possible to perform a stable polar coordinate conversion even in the case of asymmetrical patterns by way of using this point as the origin of the polar coordinate conversion. As a result of this investigation, it was found that inclination-angles can be detected with good precision, while reducing the quantity of calculations required, by taking this rotation-resistant reference point as origin of the polar coordinate conversion. This will be described in detail below with reference to the accompanying drawings.

First, the fact that it is difficult to determine inclination-angles with sufficient precision even if a positional reference point determined by ordinary pattern matching is used as the origin of a polar coordinate conversion will be illustrated by way of using FIGS. 1 through 4. Next, the fact that inclination-angles can be determined with good precision if a rotation-resistant reference point is used as the origin of this polar coordinate conversion will be illustrated by way of using FIGS. 5 through 7.

Figure 1:
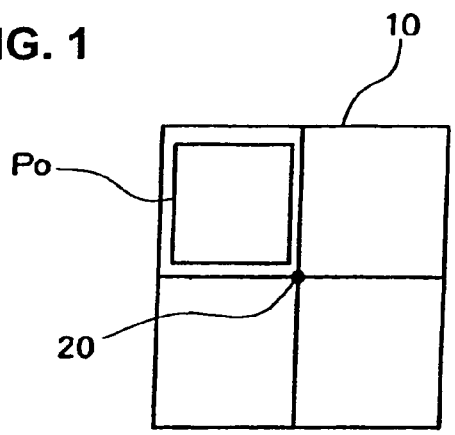
FIG. 1 shows a reference-image.

FIG. 1 shows the conditions of a reference-image 10 that is imaged so as to include a positioning pattern Po. For example, an image that is obtained by imaging the positioning pattern Po with a reference chip used as a positioning reference in a reference position is used as the reference-image 10. In the example shown in FIG. 1, the positioning pattern Po is imaged as a square pattern that is parallel to the longitudinal axis and horizontal axis of the reference-image. For example, the center position 20 of the reference-image 10 can be taken as an indicator of the position of the positioning pattern Po. Here, furthermore, the "positioning pattern Po" refers not to the positioning pattern that is used to position the image itself, but rather to the portion of the positioning pattern that is imaged within the image. However, this is abbreviated and is simply called the "positioning pattern". Accordingly, when the term "positioning pattern" is used below, there may be cases in which this indicates the positioning pattern on the surface of the chip prior to imaging, and cases in which this indicates the portion of the positioning pattern that is imaged within the image following the imaging of this positioning pattern.

Figure 2A:
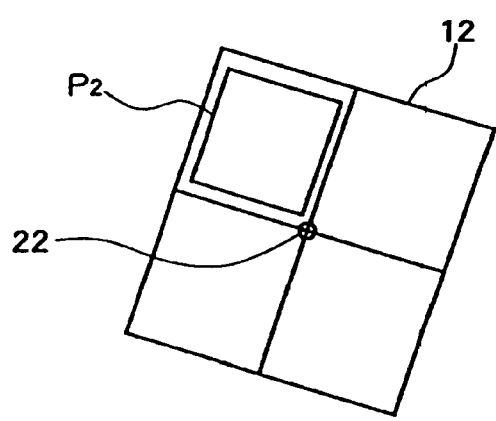
FIGS. 2A and 2B show how the positioning pattern disposed at an inclination (constituting the object of comparison) is imaged, and how the position of the positioning pattern that is the object of comparison is determined by pattern matching with the reference-image.

FIG. 2A shows the conditions of a positioning pattern $P_2$ that is disposed at an inclination as the object of comparison. When imaging is performed with a camera, only the positioning pattern $P_2$ disposed at an inclination is obtained. Here, the image region corresponding to FIG. 1 is indicated as the image region 12 in FIG. 2A, and the center position of this image region 12 is indicated as 22. Since the image region 12 and center position 22 vary in association with the inclination of the positioning pattern, the center position 22 in FIG. 2A indicates the true position of the positioning pattern $P_2$ disposed at an inclination.

Figure 2B:
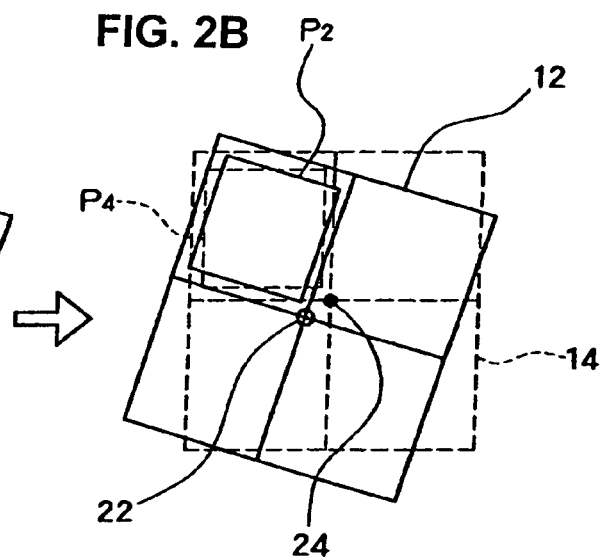

FIG. 2B shows how the position of the positioning pattern $P_2$ that is the object of comparison is determined by pattern matching. In pattern matching, the reference-image 10 is moved parallel to the longitudinal axis and horizontal axis so that the positioning pattern $P_0$ and positioning pattern $P_2$ disposed at an inclination are superimposed. Since the two positioning patterns are inclined with respect to each other, the positioning patterns are not completely superimposed. However, the movement is stopped in the position showing the greatest degree of overlapping. The positioning pattern $P_4$ following movement in this case is shown along with the reference-image 14 and center position 24 in FIG. 2B. In pattern matching, the center position 24 in this case is taken as an indicator of the position of the positioning pattern $P_2$ that is the object of comparison. Specifically, the difference between the center position 20 taken as a positioning reference and the center position 24 obtained by pattern matching as described above is taken as an indicator of the positional deviation between the positioning pattern $P_0$ of the reference-image and the positioning pattern $P_2$ that is the object of comparison.

As shown in FIG. 2B, the center position 24 that is taken as the position of the positioning pattern $P_2$ that is the object of comparison in pattern matching differs from the center position 22 that is the true position of the positioning pattern $P_2$ constituting the object of comparison. If the positioning pattern that is the object of comparison is not inclined, then such a difference is not generated. However, if the positioning pattern that is the object of comparison is disposed at an inclination, then a difference is generated between the position of the object of comparison thus determined by pattern matching and the true position.

Figure 3A:
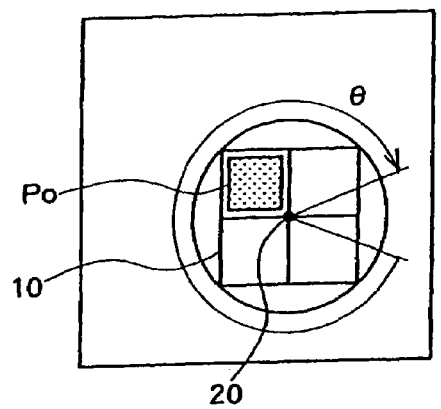
FIGS. 3A and 3B show the conditions of the polar coordinate conversion of the reference-image according to the present invention.
Figure 3B:
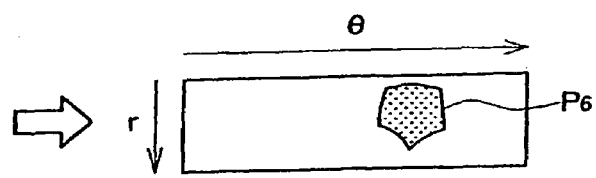
Figure 4A:
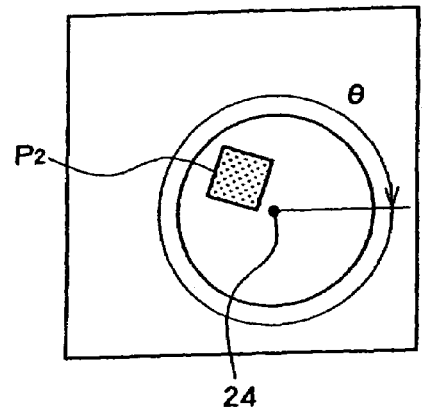
FIGS. 4A and 4B show the conditions of the polar coordinate conversion of the object-image according to the present invention.
Figure 4B:
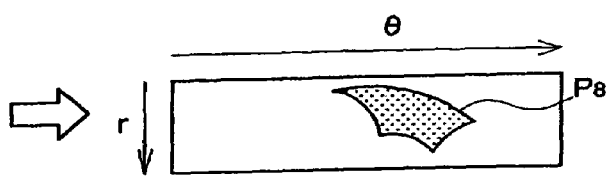

The conditions of the polar coordinate conversion of the positioning patterns $P_0$ and $P_2$ are shown in FIGS. 3 and 4. FIGS. 3A and 4A show the positioning patterns $P_0$ and $P_2$ prior to the polar coordinate conversion, and FIGS. 3B and 4B show the positioning patterns $P_6$ and $P_8$ following the polar coordinate conversion, by way of using the axis in the direction of the radius r and the axis in the direction of the angle θ. FIGS. 3A and 3B show the conditions of the polar coordinate conversion of the positioning pattern $P_0$ of the reference-image 10. The center position 20 illustrated in FIG. 1 is used as the origin of the polar coordinate conversion. FIGS. 4A and 4B show the conditions of the polar coordinate conversion of the positioning pattern $P_2$ that is disposed at an inclination; the center position 24 obtained in the pattern matching illustrated in FIG. 2 is used as the origin of the polar coordinate conversion in this case.

The relative inclination-angle between the positioning patterns $P_0$ and $P_2$ is determined from a comparison of the positioning patterns $P_6$ and $P_8$ following the polar coordinate conversion. Specifically, both positioning patterns $P_6$ and $P_8$ are caused to move in relative terms along the angular axis, and this movement is stopped in the position where the positioning patterns show the greatest degree of overlapping; the inclination-angle can be determined based upon the movement angle. However, the positioning pattern $P_6$ shown in FIG. 3B and the positioning pattern $P_8$ shown in FIG. 4B differ considerably in terms of the conditions of these positioning patterns, so that the inclination-angle cannot be determined with sufficient precision even if pattern matching is performed on the angular axis. If the center position 22 indicating the true position illustrated in FIG. 2 is taken as the origin of the polar coordinate conversion in FIG. 4A, then the conditions of the positioning pattern following this polar coordinate conversion are close to those shown in FIG. 3B; accordingly, it may be predicted that the inclination-angle can be determined with some degree of precision. However, since the inclination of the positioning pattern $P_2$ is necessary for the calculation of the center position 22 shown in FIG. 2, the problem returns in a vicious circle, so that resolution is difficult.

Thus, the pattern obtained by a polar coordinate conversion varies greatly according to the placement of the origin of the polar coordinate conversion, and the precision of angle detection is influenced by this. Furthermore, as described above, in cases where the positioning pattern that is the object of comparison is disposed at an inclination, the inclination-angle cannot be determined with satisfactory precision even if the position determined by ordinary pattern matching is used "as is" as the origin of the polar coordinate conversion.

Next, a case in which a rotation-resistant reference point is taken as the origin of the polar coordinate conversion will be described. In order to facilitate comparison, the positioning patterns used are the same as those shown in FIGS. 3 and 4. In this case, since the positioning patterns are square, the rotation-resistant reference point is the center point of the square positioning pattern regardless of which of the two embodiments described in Japanese Patent Application Laid-Open (Kokai) No. S63-56764 is used. Furthermore, even if the positioning patterns have an asymmetrical shape, results that are similar to those described below are obtained if the rotation-resistant reference point is determined according to the two embodiments of Japanese Patent Application Laid-Open (Kokai) No. 2002-208010, and this point is taken as the origin of the polar coordinate conversion.

Figure 5A:
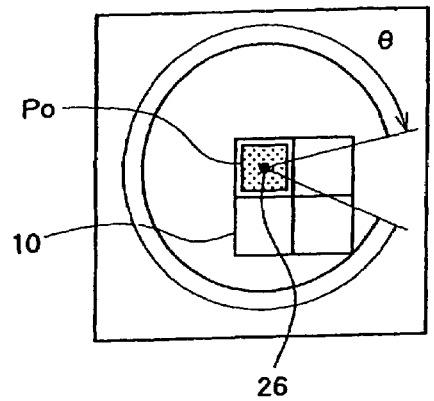
FIGS. 5A and 5B show the conditions of the polar coordinate conversion of the reference-image based on the principle of the present invention.
Figure 5B:
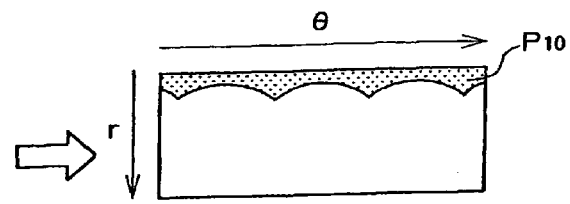
Figure 6A:
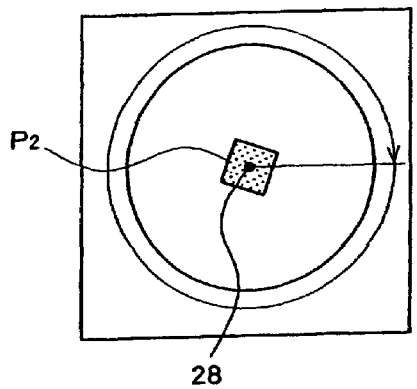
FIGS. 6A and 6B show the conditions of the polar coordinate conversion of the object-image based on the principle of the present invention.
Figure 6B:
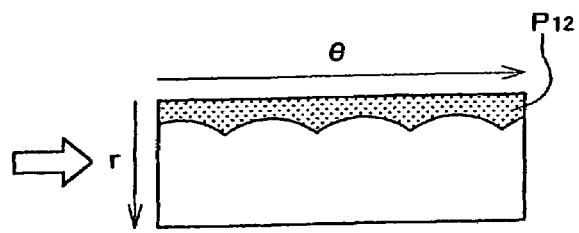

FIGS. 5 and 6 show the conditions of a polar coordinate conversion performed for the positioning patterns $P_0$ and $P_2$ with this rotation-resistant reference point set as the origin 26. FIGS. 5A and 6A show the positioning patterns $P_0$ and $P_2$ prior to the polar coordinate conversion, and FIGS. 5B and 6B show the positioning patterns $P_{10}$ an $P_{12}$ following the polar coordinate conversion, by way of using the axis in the direction of the radius r and the axis in the direction of the angle θ. FIGS. 5A and 5B show the conditions of the polar coordinate conversion of the positioning pattern $P_0$ of the reference-image 10, and FIGS. 6A and 6B show the conditions of the polar coordinate conversion of the positioning pattern $P_2$ that is disposed at an inclination. The origins 26 and 28 of these polar coordinate conversions are both the centers of the square shapes of the positioning patterns $P_0$ and $P_2$ as described above.

Figure 7:
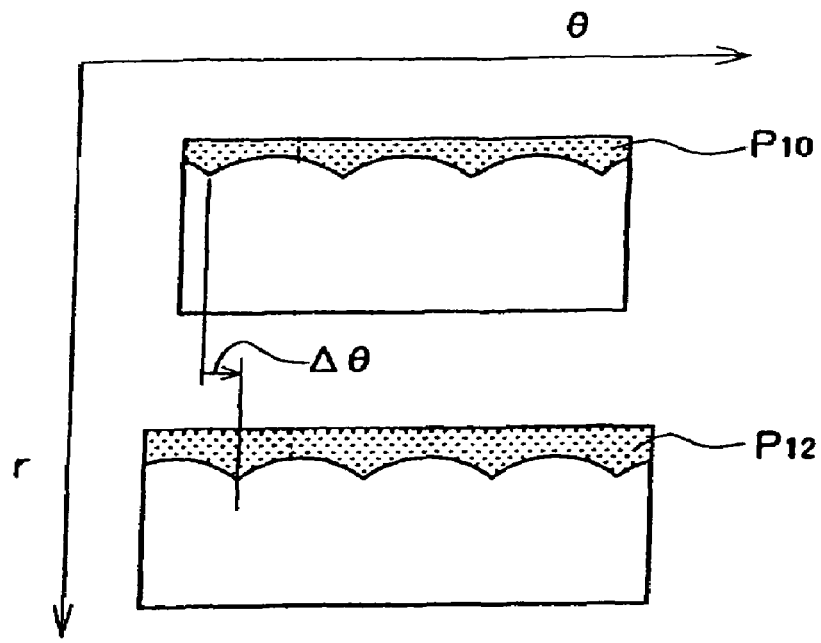
FIG. 7 shows how the inclination-angle $\Delta\theta$ is determined based upon the principle of the present invention.

FIG. 7 shows the image that is thus obtained following the polar coordinate conversion performed on the reference-image 10 as described above and the image that is obtained following the polar coordinate conversion performed on the image that is the object of comparison, arranged on the same angular axis. Thus, the positioning patterns $P_{10}$ and $P_{12}$ following the polar coordinate conversion have shapes that are relatively easy to compare. The deviation Δθ in the direction of the angular axis is determined from this comparison, and this is the inclination-angle of the positioning pattern $P_2$ with respect to the positioning pattern $P_0$.

Furthermore, polar coordinate conversion for the object of comparison is performed over 360°. However, as seen from FIG. 7, it is not always necessary to perform this conversion over 360° for the reference-image 10 if a polar coordinate conversion can be performed for a sufficiently large angular range with respect to the inclination-angle Δθ. For example, in a case where it is attempted to detect the inclination-angle within $Δθ_0$, a polar coordinate conversion can be performed in an angular range of $(360°-2Δθ_0)$. Furthermore, the radius r of the polar coordinate conversion can be set arbitrarily. However, if this radius is set at a value that is too small, the amount of information from the positioning patterns $P_0$ and $P_2$ is reduced, and there may be cases in which this has an effect on the detection precision of the inclination-angle. Preferably, this radius is set at the smallest radius that can accommodate all of the positioning patterns $P_0$ and $P_2$. By thus keeping the angular range and radius of the polar coordinate conversion at minimum values, it is possible to shorten the processing time of the pattern matching performed for the image following the polar coordinate conversion.

As described above, it was found that the inclination-angle can be detected with good precision while reducing the amount of calculation required by taking a rotation-resistant reference point as the origin of the polar coordinate conversion. The bonding pattern discrimination of the present invention was devised based upon this result.

Embodiments of the present invention will be described in detail below with reference to the accompanying drawings. In the following description, a wire bonding apparatus is used as an example of a device by way of using the bonding pattern discrimination method of the present invention. However, the apparatus used may be some other apparatus besides this, as long as this apparatus is a bonding apparatus that performs bonding by way of using positioning patterns. For example, this apparatus may be a die bonding apparatus that performs die bonding by way of using positioning patterns, a face-down bonding apparatus, or a wire bonding apparatus in stacked ICs, in which chips are stacked on top of other chips, etc. Furthermore, the apparatus may also be an electronic part bonding apparatus that performs the bonding of electronic parts other than semiconductor chips to circuit boards, etc.

In the following description furthermore, bonding pads disposed on the surface of the chip are used as a positioning pattern used in boning. However, this pattern may also be a pattern used exclusively for positioning. Moreover, the external rectangular shape of the chip itself may also be used as one positioning pattern in working the present invention.

Embodiment 1

Figure 8:
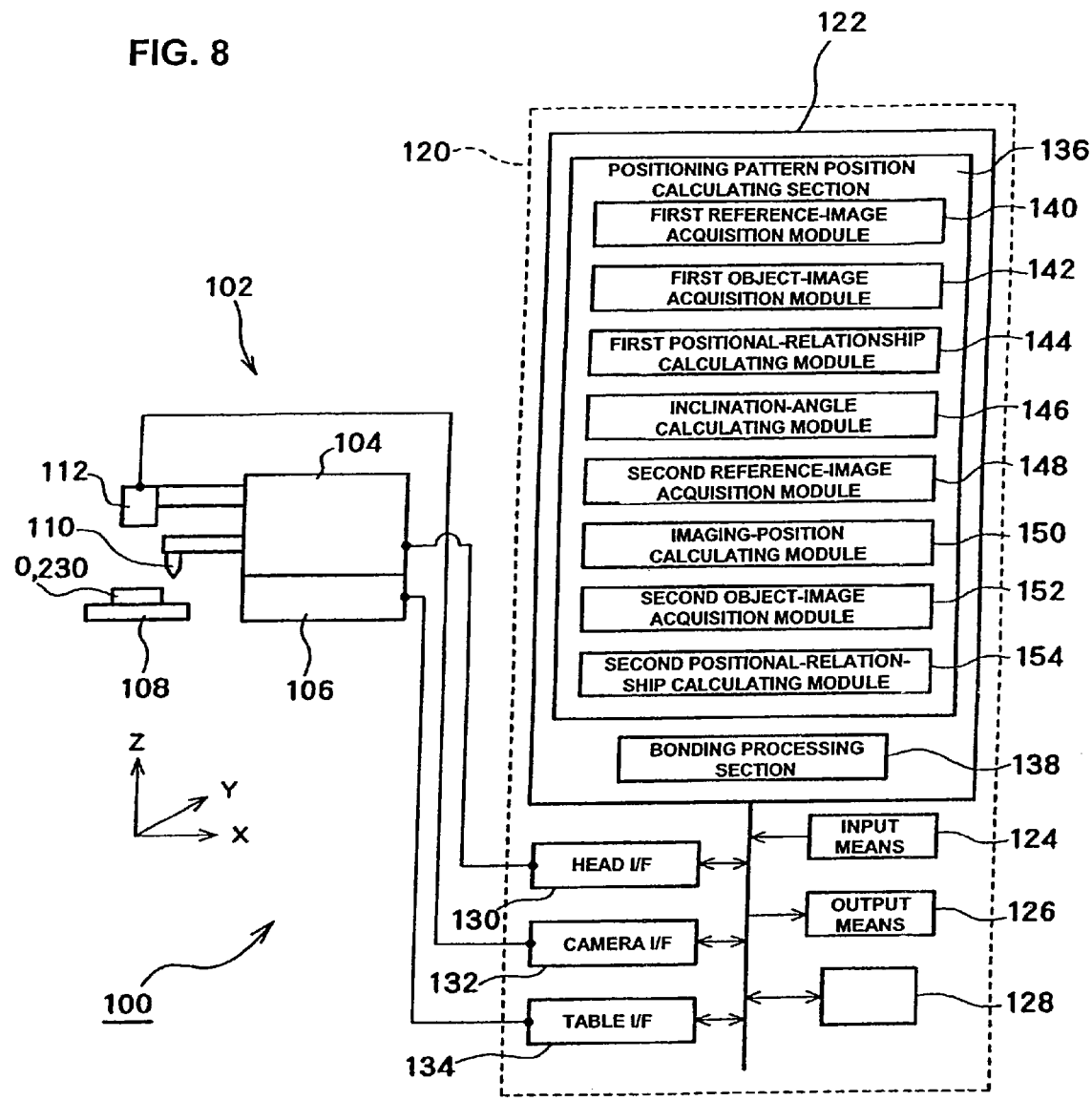
FIG. 8 is a block diagram of a wire bonding apparatus by way of using a bonding pattern discrimination method constituting an embodiment of the present invention.

FIG. 8 is a block diagram of a wire bonding apparatus 100 by way of using the bonding pattern discrimination method of the present invention. Furthermore, a reference chip 90 or bonding object chip 92 used to discriminate the positioning pattern is also shown, although this is not a constituent element of the wire bonding apparatus 100.

The wire bonding apparatus 100 comprises an apparatus main body 102 and a control section 120. The apparatus main body includes a bonding head 104, a table 106 which moves the bonding head 104 within the XY plane shown in FIG. 8, and a stage 108 that holds the chips 90, 92. A tool 110 which bonds a wire to the chips, and a camera 112 which detects the positions of the chips 90, 92, are attached to the bonding head 104. The bonding head 104 is connected to the bonding head I/F 130 of the control section 120 by a single line. Similarly, the camera 112 is connected to the camera I/F 132, and the table 106 is connected to the table I/F 134, via respective signal lines.

The control section 120 has the function of controlling the overall operation of the elements that constitute the apparatus main body 102. In particular, this control section 120 has the functions of discriminating the inclination of the positioning patterns used in boning, and performing wire bonding based upon the results of this discrimination. Such a control section 120 can be constructed from a general computer, or a computer that is especially meant for use in a bonding apparatus.

The control section 120 includes a CPU 122, an input means 124 such as a keyboard or input switch, etc., an output means 126 such as a display, a memory 128 which stores image data, etc., and the above-described bonding head I/F 130, camera I/F 132 and table I/F 134; and these elements are connected to each other by an internal bus.

The CPU 122 includes a pattern discrimination processing section 136 which has the function of performing processing that discriminates the inclination of the positioning pattern used in bonding, and a bonding processing section 138 which has the function of setting the wire bonding conditions and performing wire bonding processing based upon the positioning pattern whose inclination has been discriminated. Software can be used to perform such processing; specified processing can be performed by executing corresponding bonding pattern discrimination programs and bonding programs. Furthermore, some of the processing may also be performed by hardware.

The functions from the reference-image acquisition module 140 to the inclination-angle calculation module 154 of the pattern discrimination processing section 136 will be described with reference to the flow chart shown in FIG. 9. Symbols corresponding to the symbols in FIGS. 1 through 8 will be used. Furthermore, in regard to the images corresponding to the respective steps, corresponding images in FIGS. 1 through 7 will be indicated if necessary.

First, the reference chip 90 is set (S10). More specifically, a chip used as a reference for the discrimination of the inclination of positioning pattern is set as the reference chip 90, and this chip is held on the stage 108. Next, the camera 112 is moved, and is brought to a position in which the imaging field can capture the positioning pattern $P_0$ of the reference chip 90 (S12).

Then, an image including the positioning pattern $P_0$ is acquired, and this image is stored as the reference-image (S14). More specifically, the reference-image acquisition module 140 sends instructions to the camera 112 via the camera I/F 132, the positioning pattern $P_0$ of the reference chip 90 is imaged, and this data is stored in the memory 128. The acquired image corresponds to the reference-image 10 shown in FIG. 1. The camera 112 is provided with a function that superimposes crosshairs on the image in order to indicate a reference for the imaging range; the intersection point of these crosshairs is the center position 20 of the imaging range. In subsequent processing relating to the image, these crosshairs are taken as the reference coordinate axes, and the center position 20 constituting the intersection point is taken as the coordinate origin.

Next, the reference conversion origin which is the origin for the polar coordinate conversion is specified for this reference-image 10 (S16). More specifically, the reference conversion origin specifying module 142 calculates the rotation-resistant reference point described in the principle of the present invention based upon the data for the reference-image 10 stored in the memory 128, and specifies these coordinates as the rotation-resistant reference point. Furthermore, as described above, the coordinates of the reference conversion origin are specified by way of using the center position 20 as a reference. The detailed content of this step will be described later in Embodiments 1 and 2. The specified reference conversion origin corresponds to the origin 26 in FIG. 5.

The reference-image 10 is subjected to a polar coordinate conversion by way of using the specified reference conversion origin (S18), and the resulting image is stored in the memory 128 as the post-conversion reference-image. More specifically, the reference-image conversion module 144 reads out the reference-image 10 from the memory 128, determines the coordinates of the specified reference conversion origin by way of using the center position 20 as a reference, and takes these coordinates as the origin of the polar coordinate conversion. Furthermore, for example, the angle θ is varied in the clockwise direction, and calculations that convert the brightness data of the reference-image as a function of the radius r are performed for each angle θ. Accordingly, in the post-conversion reference-image, the brightness data is disposed with the horizontal axis taken as the angle θ, and the vertical axis taken as the radius r. Such a post-conversion reference-image corresponds to the image shown in FIG. 5B.

The steps up to this point are training steps that use the reference chip 90; next, and running steps that use the bonding object chip 92 are performed next.

In the running steps, the bonding object ship 92 is first set (S20). Specifically, the reference chip 90 is removed from the stage 108, and the chip 92 that is the object of bonding is set on the stage 108. Then, imaging is performed in the same visual field as that used for the imaging of the reference-image 10, and this image is stored in the memory 128 as the object-image (S22). More specifically, the object-image acquisition module 146 sends instructions to the camera 112 via the camera I/F 132 so that the positioning pattern $P_2$ of the boning object chip 92 is imaged, and this data is stored in the memory 128. The acquired object-image corresponds to FIG. 2A or FIG. 6A.

Next, pattern matching is performed between the reference-image 10 and object-image, and the relative positional-relationship between the positioning pattern $P_0$ of the reference chip 90 and the positioning pattern $P_2$ of the bonding object chip is calculated (S24). More specifically, the positional-relationship calculation module 148 reads out the reference-image 10 and object-image from the memory 128, adjusts the origin of the imaging field, arranges the object-image and reference-image, and moves both images parallel to each other so that the positioning pattern of the reference-image and the positioning pattern of the object-image show a maximum degree of overlapping. For example, normalized correlation calculations can be used as the pattern matching method. As a result of this pattern matching, the center position of the reference-image moves from the original center position 20 to the center position 24; the amount of this movement ($\Delta X$, $\Delta Y$) is determined. This amount of movement ($\Delta X$, $\Delta Y$) indicates the relative position of the positioning pattern of the object-image by way of using the center position 20 of the reference-image 10 as a reference. The conditions of pattern matching correspond to FIG. 2B.

Next, the object conversion origin, which is the origin used for the polar coordinate conversion of the object-image, is specified (S26). More specifically, the object conversion origin specifying module 150 performs the following calculations. Specifically, if the coordinates of the origin 26 for reference conversion by way of using the center position 20 as a reference are designated as ($X_{26}$, $Y_{26}$), and the coordinates of the object conversion origin are designated as ($X_{28}$, $Y_{28}$), then ($X_{28}=X_{26}+\Delta A$, $Y_{28}=Y_{26}+\Delta Y$). The object conversion origin corresponds to the origin 28 in FIG. 6A.

Using the object conversion origin thus specified, the object-image is subjected to a polar coordinate conversion (S28), and this image is stored in the memory 128 as the post-conversion object-image. More specifically, the object-image conversion module 152 reads out the object-image from the memory 128, determines the coordinates of the specified reference conversion origin, takes these coordinates as the origin of the polar coordinate conversion, varies the angle θ in, for example, the clockwise direction, and performs calculations that converts the brightness data of the reference-image as a function of the radius r for each angle θ. Such a post-conversion reference-image corresponds to the image shown in FIG. 6B.

Pattern matching is performed for the post-conversion reference-image and post-conversion object-image thus obtained, and the inclination-angle is calculated (S30). More specifically, the inclination-angle calculation module 154 reads out the post-conversion reference-image and post-conversion object-image from the memory 128, adjusts the origin of the angular axis, arranges both images, causes both images to move parallel to each other along the angular axis, and determines the amount of movement $\Delta\theta$ which is such that the overlapping between the positioning pattern of the post-conversion reference-image and the positioning pattern of the post-conversion object-image shows a maximum value. This amount of movement $\Delta\theta$ indicates the relative inclination-angle of the positioning pattern $P_2$ of the boning object chip 92 by way of using the positioning pattern $P_0$ of the reference chip 90 as a reference. The conditions of the determination of the inclination-angle $\Delta\theta$ correspond to FIG. 7.

When the inclination-angle of the positioning pattern is thus determined in the running steps, the processing required for wire bonding is performed by the function of the bonding processing section 138. For example, the positions of the respective bonding pads registered beforehand as standard positions are corrected by way of using the determined angle of inclination. Then, instructions are sent to the table 106 via the table I/F 134 so that the tool 110 is moved to the corrected bonding pad positions, and when the tool 110 is moved to these positions, instructions are sent to the bonding head 104 via the bonding head I/F 130 so that the tool operations required for wire bonding are performed. Thus, wire bonding is performed.

Embodiment 2

Figure 10:
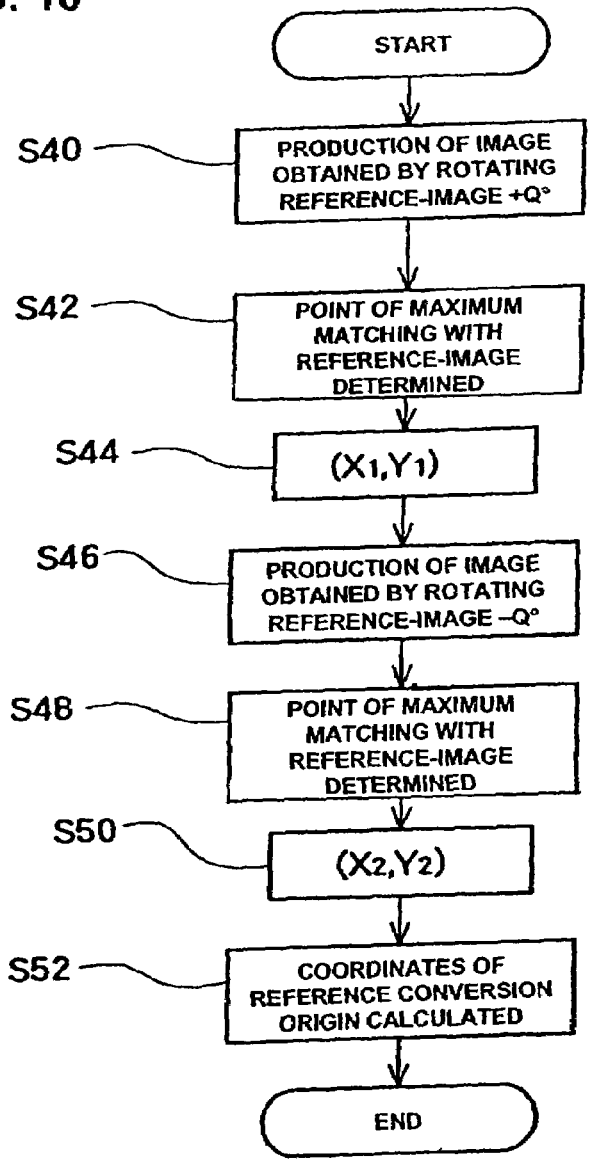
FIG. 10 is a detailed internal flow chart of the reference conversion origin specifying step in Embodiment 2.
Figure 11:
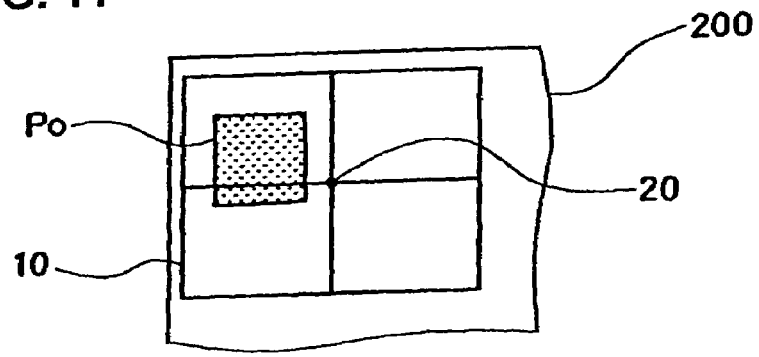
FIG. 11 shows the relationship between the positioning pattern and the external shape of the reference chip for the reference-image.

The more detailed content of the reference conversion origin specifying step will be described. Embodiment 2 corresponds to an embodiment in which the first embodiment in the above-described Japanese Patent Application Laid-Open (Kokai) No. 2002-208010 is applied to the boning positioning patterns. The detailed content of this reference conversion origin specifying step will be described with reference to the internal flow chart shown in FIG. 10, and FIGS. 11 through 16. In FIG. 10, and FIGS. 11 through 16, elements that are the same as elements shown in FIGS. 1 and 2 are labeled with the same symbols, and a detailed description of such elements is omitted. Furthermore, the procedure shown in the internal flow chart in FIG. 10 is performed by internal modules in the reference conversion origin specifying module 142 in the CPU 122 illustrated in FIG. 8.

Figure 9:
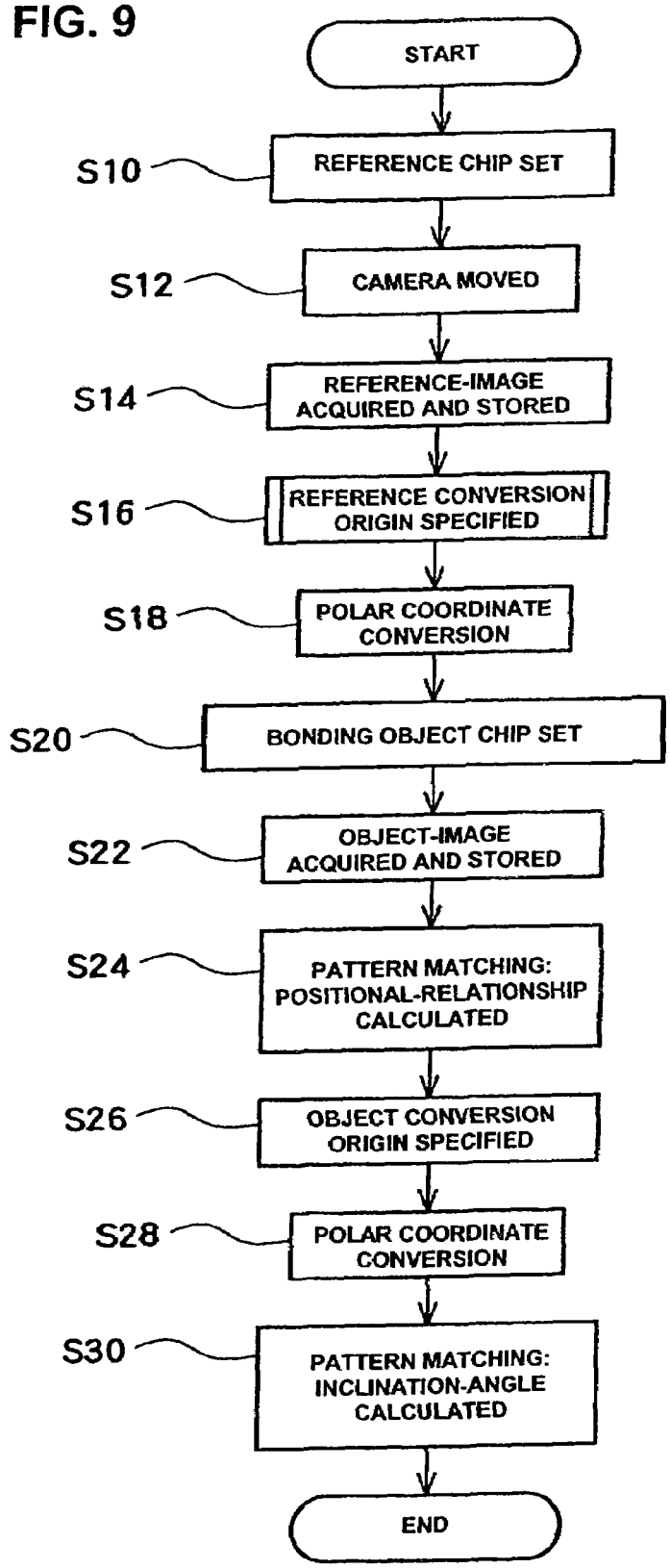
FIG. 9 is a flow chart which shows the procedure of bonding pattern discrimination in an embodiment of the present invention.

The reference-image 10 acquired by the steps S10 through S14 illustrated in FIG. 9 is used to specify the reference conversion origin. FIG. 11 is a diagram which again shows the relationship between the positioning pattern $P_0$ and the external shape of the reference chip 90 for the reference-image 10. FIG. 9 is similar to FIG. 1. However, it is indicated that the positioning pattern $P_0$ uses square bonding patterns that are disposed in the vicinity of the corners of the reference chip 90. Furthermore, the range of the reference-image 10 is set on the inside of the outer shape line of the reference chip 90 so that noise from this outer shape line cannot enter. In order to indicate that there is no objection to the disposition of the positioning pattern $P_0$ intersecting with the crosshairs, the disposition of the positioning pattern is slightly different than that shown in FIG. 1. In the subsequent processing, the crosshairs of the reference-image 10 are taken as the reference coordinate axes, and the center position 20 constituting the intersection point of the cross hairs is taken as the origin of the reference axes.

Figure 12:
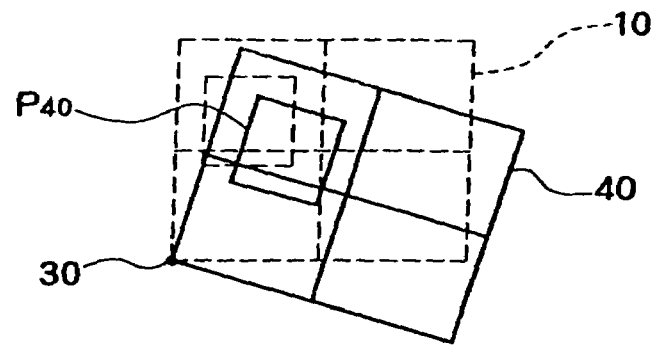
FIG. 12 shows the conditions of the rotated image that is rotated +Q° about the lower left corner in the reference-image in Embodiment 2.

Using this reference-image 10, a rotated image obtained by rotating the image $+Q°$ about one corner of the reference-image 10 is produced (S40). FIG. 12 shows the conditions of the rotated image 40 centered on the point 30 at the lower left corner in the reference-image 10.

Figure 13:
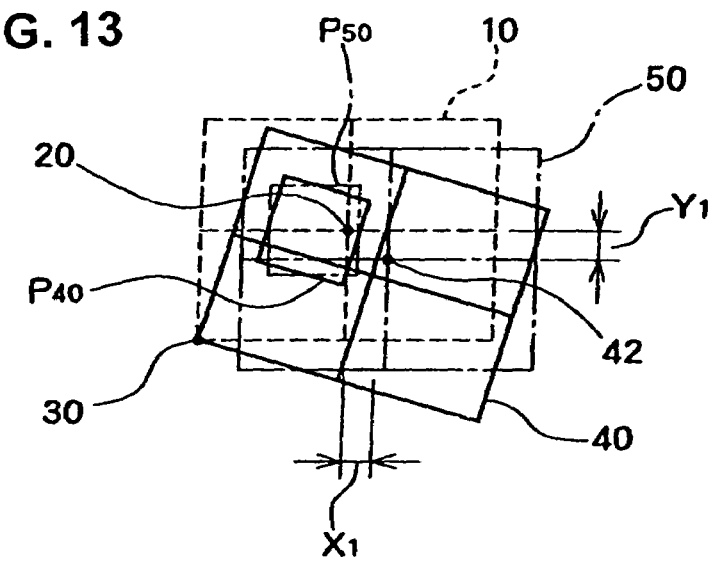
FIG. 13 shows the conditions of pattern matching between the rotated image that is rotated +Q° and the reference-image in Embodiment 2.

Next, the point of best matching is determined by pattern matching between the reference-image 10 and the rotated image 40 (S42). More specifically, the reference-image 10 is moved parallel to the rotated image 40 so that maximum overlapping is obtained between the positioning pattern of the reference-image 10 and the positioning pattern of the rotated image 40. The center position in the reference-image 50 in the case of maximum overlapping is the point of best matching 42 of both images. The conditions of this matching are shown in FIG. 13. The coordinates of the original center position 20 of the reference-image 10 are designated as (0, 0), and the coordinates of the point of best matching 42 are designated as $(X_1, Y_1)$ (S44).

Figure 14:
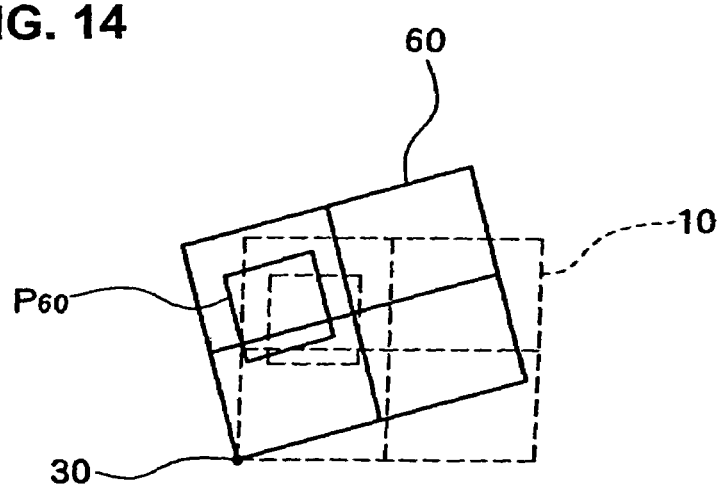
FIG. 14 shows the conditions of the rotated image that is rotated −Q° about the lower left corner in the reference-image in Embodiment 2.
Figure 15:
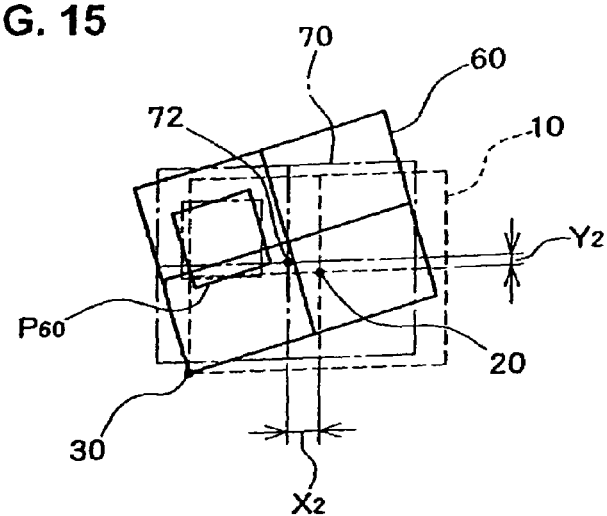
FIG. 15 shows the conditions of pattern matching between the rotated image that is rotated −Q° and the reference-image in Embodiment 2.

Similarly, as shown in FIG. 14, a rotated image 60 that is rotated $-Q°$ about the corner point 30 of the reference-image 10 is produced (S46). Then, the point of best matching of both images is determined by pattern matching between the reference-image 10 and rotated image 60 (S48). More specifically, as shown in FIG. 15, the reference-image 10 is moved parallel to the rotated image 60 so that the positioning pattern of the reference-image 10 and the positioning pattern of the rotated image 60 show a maximum degree of overlapping. The center position of the reference-image 70 in the case of maximum overlapping is the point of best matching 72. The coordinates of the point of best matching 72 are designated as $(X_2, Y_2)$ (S50).

The coordinates of the reference conversion origin are calculated by way of using the coordinates $(X_1, Y_1)$ of the point of best matching 42 thus determined, the coordinates $(X_2, Y_2)$ of the point of best matching 72, the rotational angle $Q°$, and the coordinates (XC1, YC1) of the corner point 30 taken as the center of rotation (S52). The coordinates (AX1, AY1) of the reference conversion origin are expressed by the Equations (1) through (4) as described above.

$$AX1 = XC1 + r\cos\alpha \quad (1)$$

$$AY1 = YC1 + r\sin\alpha \quad (2)$$

Here, $\alpha = \tan^{-1}\{(X_2-X_1)/(Y_1-Y_2)\}$ (3)

$r = \sqrt{\{(X_2-X_1)^2+(Y_1-Y_2)^2\}}/2\sin Q$ (4)

Figure 16:
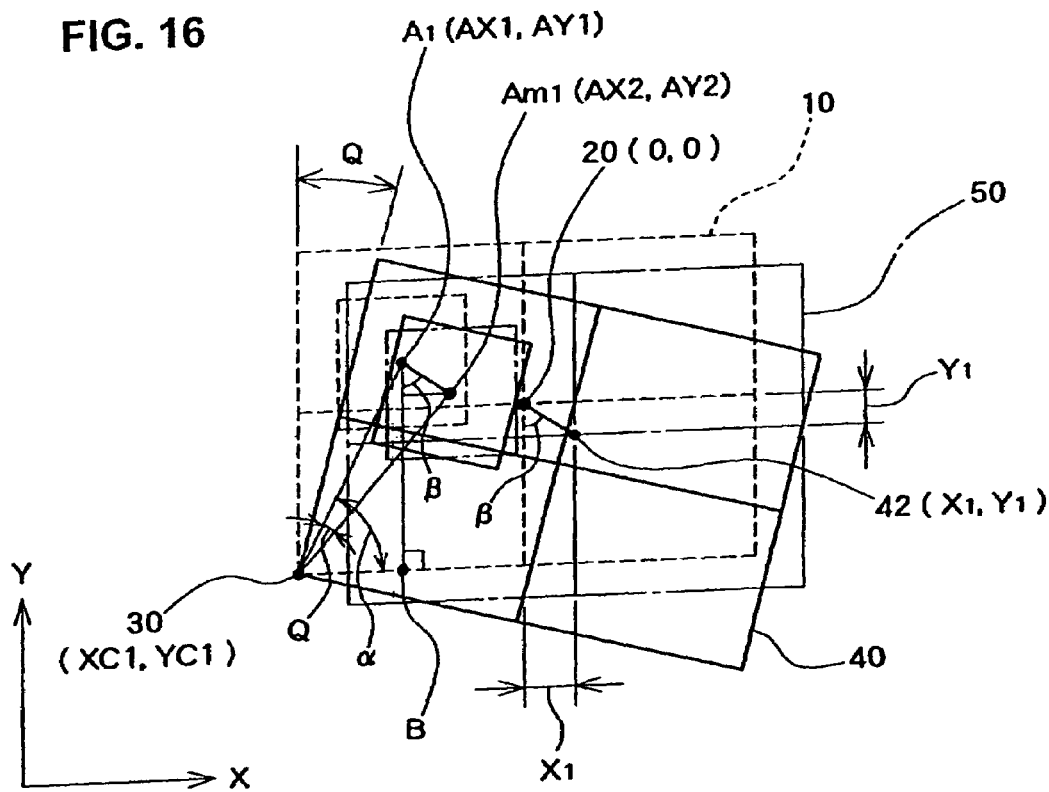
FIG. 16 is diagram which illustrates the content of the equation used to determine the reference conversion origin in Embodiment 2.

FIG. 16 enlarges FIG. 13 in order to illustrate the meaning of the Equations (1) through (4), and shows the corresponding coordinates and angles. Here, the point $A_1$ is the reference conversion origin for the reference-image 10, and the point $A_{ml}$ is the reference conversion origin for the reference-image 50. Since the pattern matching is performed by parallel movement of the reference-images, the accompanying movement of the reference conversion origin is the same as the movement of the center position of the reference-image. Specifically, the positional-relationship of the point $A_1$ and point $A_{ml}$ is the same as the positional-relationship of the center positions 20 and 42.

Equation (3) can be explained utilizing the fact that the angle in FIG. 16 (point 30-point $A_1$-point $A_{ml}$) can be approximated by a right angle in cases where the angle Q is very small. Specifically, if the leg of a perpendicular line dropped to the X axis shown in FIG. 16 from the point $A_1$ is designated as point B, and the angle (point $A_{ml}$-point $A_1$-point B) is designated as $\beta$, then, from the above-described approximation, the angle (point 30-point $A_1$-point B)=$90°$=$-\beta$, and the other angle (pint $A_1$-point B-point 30)=$90°$. Accordingly, the angle (point $A_1$-point 30-point B)=$\alpha=\beta$. Furthermore, since, $\beta=\tan^{-1}(X_1/Y_1)$, $\alpha=\tan^{-1}(X_1/Y_1)$. Equation (3) is an equation in which this is rewritten as an equation by way of using $(X_1, Y_1)$ and $(X_2, Y_2)$.

Equation (4) can be explained utilizing the fact that the distance between the tip ends of mutually equal line segments of a length r on both sides of the angle Q can be approximated by $r\times\sin Q$ in cases where the rotational angle Q is very small. Specifically, the length of the line segment (point $A_1$-point $A_{ml}$)=$r\times SinQ$=the length of (point 20-point 42)=$\sqrt{\{(X_1)^2+(Y_1)^2\}}$; accordingly, $r=\sqrt{\{(X_1)^2+(Y_1)^2\}}/\sin Q$ is obtained from this. Equation (4) is an equation in which this is rewritten as an equation by way of using $(X_1, Y_1)$ and $(X_2, Y_2)$.

When r and $\alpha$ are thus determined from the coordinates $(X_1, Y_1)$ and $(X_2, Y_2)$ and the rotational angle Q, the coordinates (AX1, AY1) of the reference conversion origin in the reference-image 10 can be calculated specified by Equations (1) and (2) by way of using the coordinates (XC1, YC1) of the point 30.

The method used to specify the reference conversion origin in Embodiment 2 can be used even if the positioning pattern is asymmetrical. Accordingly, the inclination-angle can be calculated with better precision, without being influenced by the shape of the positioning pattern.

Embodiment 3

Figure 17:
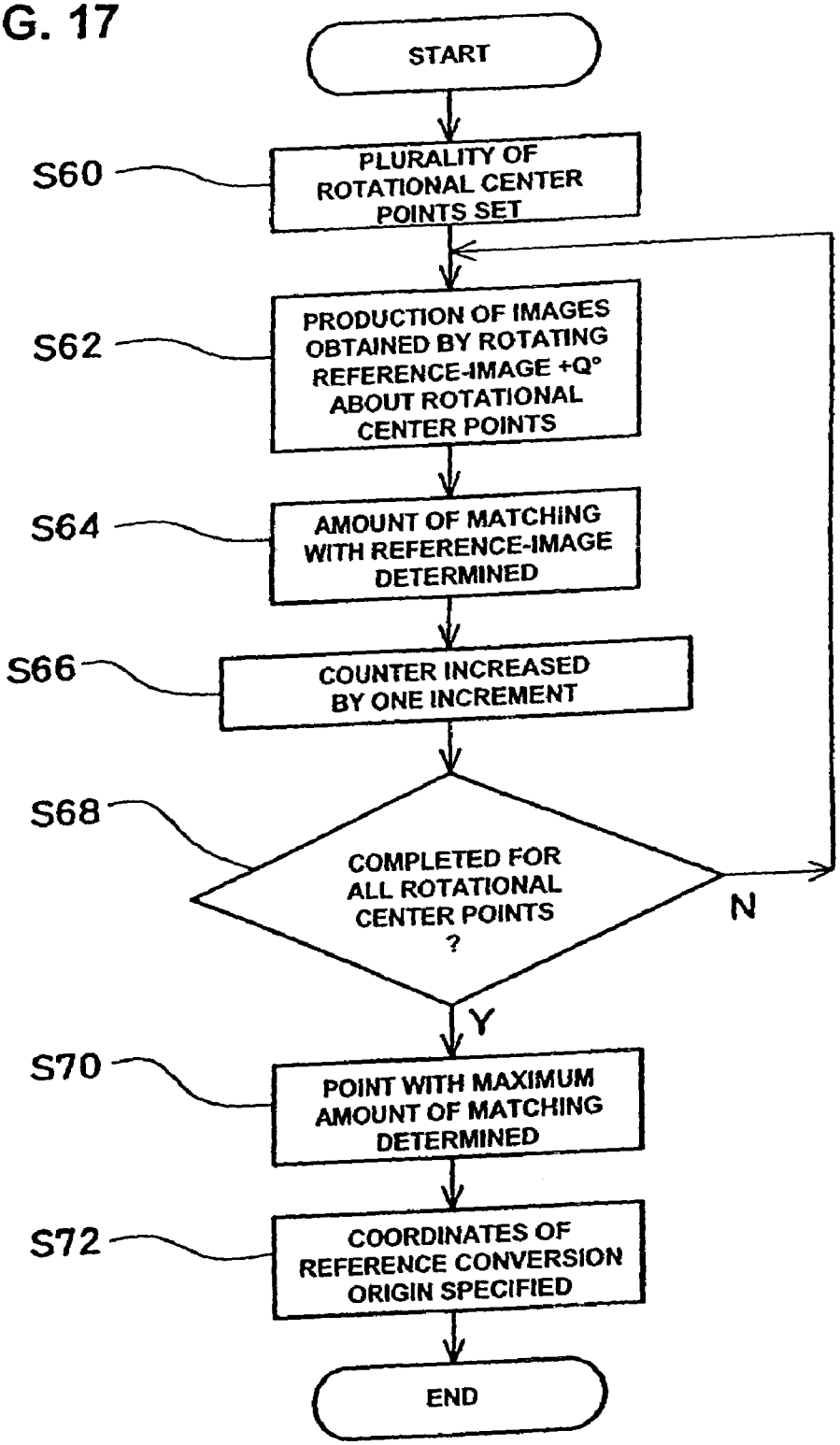
FIG. 17 is a detailed internal flow chart of the reference conversion origin specifying step in Embodiment 3.

Embodiment 3 corresponds to an embodiment in which the second embodiment in the above-described Japanese Patent Application Laid-Open (Kokai) No. 2002-208010 is applied to the bonding positioning pattern with regard to the reference conversion origin specification step. The detailed content of this reference conversion origin specification step will be described with reference to the internal flow chart shown in FIG. 17, and FIG. 18. The procedure of the internal flow chart shown in FIG. 17 is executed by internal modules of the reference conversion origin specifying module 142 in the CPU 122 illustrated in FIG. 8.

The reference-image 10 acquired in the steps S10 through S14 illustrated in FIG. 9 is also used for the specification of the reference conversion origin in Embodiment 3.

Figure 18:
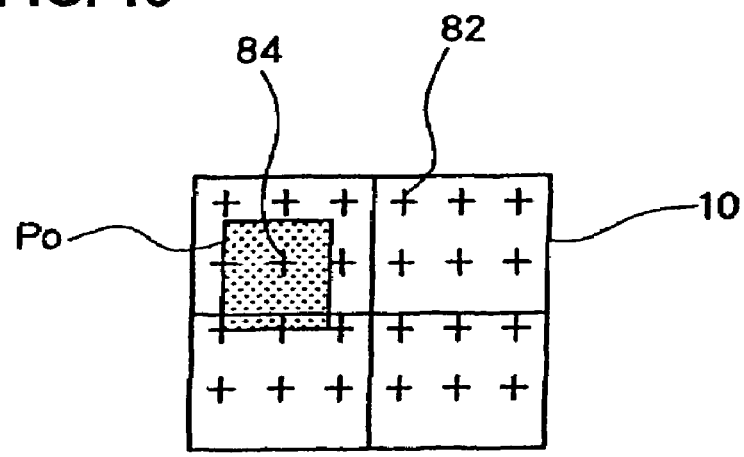
FIG. 18 shows how a plurality of rotational center points are set within the reference-image in Embodiment 3.

A plurality of rotational center points are set within this reference-image 10 (S60). The conditions of this setting are shown in FIG. 18. In this example, a plurality of rotational center points 82 are disposed at uniform intervals at a fixed spacing within the reference-image 10. The rotational center points can also be disposed within the positioning pattern $P_0$. Preferably, at least one rotational center point is disposed within the positioning pattern $P_0$. In FIG. 18, the rotational center point 84 is set within the positioning pattern $P_0$.

Next, for one rotational center point, a rotated image obtained by rotating the reference-image 10 $+Q°$ about this point is produced (S62). Then, the amount of matching between the positioning pattern of the rotated image thus produced and the positioning pattern of the reference-image 10 is determined (S64). Assuming that each positioning pattern is a bonding pad, and that the brightness data is the same for all pixels, then it may be predicted that the amount of matching will be proportional to the overlapping area of the bonding pads. The steps S62 through S64 are performed for each rotational center point (S66 through S68).

Then, when the amounts of matching have been respectively determined for all of the rotational center points, the rotational center point showing the maximum amount of matching among these rotational center points is determined (S70). Generally, the rotational center point that is closest to the center of the positioning pattern $P_O$ shows the maximum amount of matching. The coordinates of this rotational center point showing the maximum amount of matching are specified as the coordinates of the reference conversion origin (S72). In the example shown in FIG. 18, the rotational center point 84 is specified as the reference conversion origin.

Depending on the manner in which the rotational center points are set, there may be instances in which no exceptional amount of matching is obtained, and the amounts of matching are close to even. In such cases, the rotational center point showing the maximum amount of matching may be tentatively extracted and the amounts of matching of the surrounding rotational center points may be compared, and the coordinates of a position that is recognized as being close to the center of the positioning pattern may be specified as the reference conversion origin. In this case, a specified range from the maximum value of the amount of matching is set, a rotational center point that is within this range or a rotational center point that is close to this range is specified, and this point may be specified as the reference conversion origin.

Compared to the method of Embodiment 2, the method of Embodiment 3 is easier in terms of the determination of the reference conversion origin, and can greatly reduce the calculation time.

When a polar coordinate conversion is used, the range of the image that is converted is the area within a circle of radius r centered on the origin of the polar coordinate conversion. In order to obtain sufficient information, as described above, it is desirable that the magnitude of this radius r be set so as to include the positioning pattern within the range. Accordingly, in cases where the positioning pattern is not a circle, the size of the circle of radius r is larger than the size of the positioning pattern. The region that is outside the positioning pattern but inside the circle of radius r is an object of polar coordinate conversion. However, this region is not needed to determine the inclination-angle. If an excessive amount of information is incorporated into this region, this information is subjected to a polar coordinate conversion, and becomes pattern matching noise when the inclination-angle is determined.

Figure 19A:
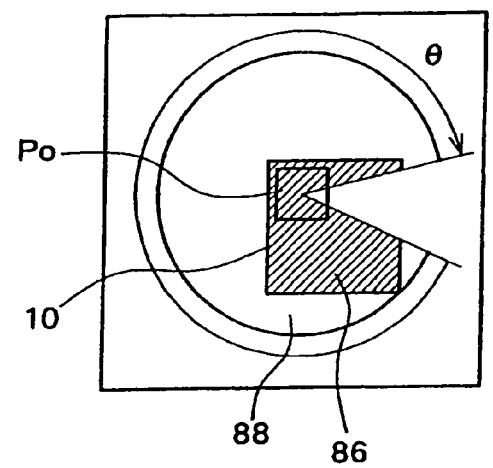
FIGS. 19A and 19b are diagrams which illustrate the mask processing in the polar coordinate conversion of the reference-image in Embodiment 4.
Figure 19B:
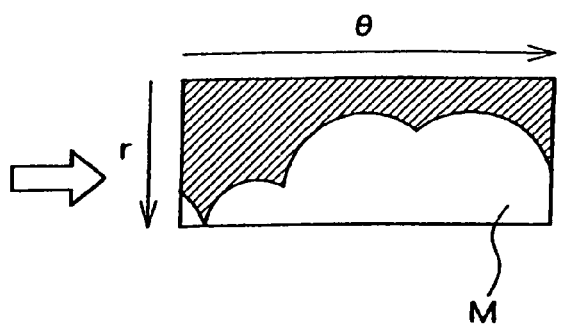

Accordingly, an embodiment in which the region that is outside the positioning pattern but inside the circle of radius r is masked will be described. FIG. 19 shows the conditions of the mask processing that is performed for the data in the region that is not needed for inclination-angle detection, based on the diagram of the polar coordinate conversion of the reference-image illustrated in FIG. 5. In FIG. 19A, the region 86 indicated by hatching is a region containing information that is needed for inclination-angle detection, and the region 88 on the outside of this is an unnecessary region. Accordingly, mask processing is performed for the data of the respective pixels in the region 88. More specifically, the brightness data of the respective pixels in this region is modulated to a specified fixed value that does not exist as an actual brightness, e. g., the maximum brightness value. In the hatched region 86, the brightness data is left "as is", and is not modulated. Accordingly, if only the mask-processed region is subjected to a polar coordinate conversion, the results are as shown in FIG. 19B. Specifically, in the post-conversion reference-image following the polar coordinate conversion, the brightness data is modulated to a fixed value in the portion corresponding to the region M, and this brightness portion is, for example, excluded from the normalized correlation calculations as being outside the object of pattern matching, so that all of the noise of this portion is eliminated.

Figure 20:
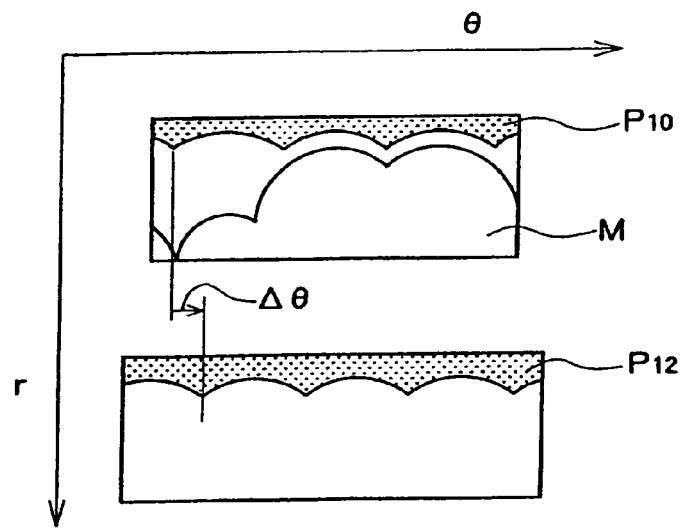
FIG. 20 shows how the inclination-angle is determined by way of using the post-conversion reference-image subjected to mask processing in Embodiment 4.

FIG. 20 shows how the inclination-angle $\Delta\theta$ is determined by way of using the post-conversion reference-image that has been subjected to mask processing. By way of using mask processing in this way, it is possible to exclude unwanted noise, so that the precision of inclination-angle detection can be improved. Furthermore, by performing mask processing, it is possible to limit the data that is subjected to a polar coordinate conversion to the amount of data in the region of the reference-image 10, so that the time required for processing can be shortened.

The present invention can be used in a bonding apparatus that performs bonding after performing positioning.

The invention claimed is:

1. A bonding pattern discrimination apparatus for discriminating an inclination of a positioning pattern used in bonding, said apparatus comprising:

a reference-image acquisition means that makes an image of positioning pattern for a reference chip that serves as a reference for discriminating an inclination of said positioning pattern and obtains said image as a reference-image;

a reference conversion origin specifying means that specifies a conversion origin that is used for a polar coordinate conversion of the reference-image;

a reference-image conversion means that performs a polar coordinate conversion on the reference-image by way of using a specified reference conversion origin; thus producing a post-conversion reference-image;

an object-image acquisition means that makes an image of the positioning pattern for a chip that is an object of bonding and acquires said image as an object-image;

a positional-relationship calculation means that moves the positioning pattern of the reference-image and the positioning pattern of the object-image in relative terms so that both images are superimposed, so that a relative positional-relationship between the positioning pattern of the reference chip and the positioning pattern of the bonding object chip is calculated from an amount of said movement;

an object conversion origin specifying means that specifies an origin that is used in order to subject the object-image to a polar coordinate conversion based upon the calculated relative positional-relationship by a positional-relationship that is the same as the positional-relationship between the positioning pattern and the reference conversion origin in the reference-image;

an object-image conversion means that performs a polar coordinate conversion on the object-image by way of using a specified object conversion origin, thus producing a post-conversion object-image; and an inclination-angle calculation means that moves both post-conversion images in relative terms on an angular axis so that a positioning pattern developed in polar coordinates in the post-conversion object-image and the positioning pattern developed in polar coordinates in the post-conversion reference-image are superimposed, so that the relative inclination-angle between the positioning pattern of the reference chip and the positioning pattern of the bonding object chip is calculated from the amount of a movement angle;

wherein said reference conversion origin specifying means is comprised of:

a rotated image acquisition means that acquires a rotated image produced by rotating the reference-image through a specified angle, and a pattern matching means that performs pattern matching by causing relative movement of the reference-image and rotated image so that the positioning pattern of the reference-image and the positioning pattern of the rotated image are superimposed; and a reference conversion origin, which is such that an error in a relative positional-relationship between two positioning patterns detected by pattern matching of an image that is an object of comparison obtained by imaging-positioning patterns disposed in an attitude that includes positional deviation in a direction of rotation, and a reference-image obtained by imaging-positioning patterns containing no positional deviation in the direction of rotation shows a minimal value, is specified based upon results of said pattern matching.

* * * * *